US012796559B2

(12) United States Patent
Lin et al.

(10) Patent No.: US 12,796,559 B2

(45) Date of Patent: Nov. 10, 2026

(54) ELECTRONIC PACKAGE STRUCTURE

(71) Applicant: Acer Incorporated, New Taipei City (TW)

(72) Inventors: Yu-Ming Lin, New Taipei City (TW); Mao-Neng Liao, New Taipei City (TW); Cheng-Wen Hsieh, New Taipei City (TW); Kuang-Hua Lin, New Taipei City (TW); Wei-Chin Chen, New Taipei City (TW); Kuan-Lin Chen, New Taipei City (TW); Chun-Chieh Wang, New Taipei City (TW)

(73) Assignee: Acer Incorporated, New Taipei City (TW)

( * ) Notice: Subject to any disclaimer, the term of this patent is extended or adjusted under 35 U.S.C. 154(b) by 382 days.

(21) Appl. No.: 18/414,485

(22) Filed: Jan. 17, 2024

(65) Prior Publication Data

US 2024/0243114 A1 Jul. 18, 2024

(30) Foreign Application Priority Data

Jan. 18, 2023 (TW) ................................ 112102431

(51) Int. Cl.

*H10W 90/00* (2026.01)
*H05K 7/20* (2006.01)

(Continued)

(52) U.S. Cl.

CPC ........ *H10W 90/00* (2026.01); *H05K 7/20445* (2013.01); *H10W 76/47* (2026.01); (Continued)

(58) Field of Classification Search

CPC ................. H10W 90/00; H10W 76/47; H10W 72/07354; H10W 72/347; H10W 90/734; (Continued)

(56) References Cited

U.S. PATENT DOCUMENTS 5,396,403 A * 3/1995 Patel ..................... H10W 40/77 257/713
5,623,394 A * 4/1997 Sherif ................. H10W 40/251 257/713

(Continued)

*Primary Examiner* — Galina G Yushina

(74) *Attorney, Agent, or Firm* — JCIPRNET

(57) ABSTRACT

An electronic package structure includes first and second package modules combined with each other. The first package module includes a substrate and a first electronic component disposed thereon, at least one second electronic component, and an insulation film. The first electronic component and the second electronic component are adjacent to each other. The insulation film includes a base material and a foam glue body, and the foam glue body is viscous and compressible. The second package module includes a heat dissipation plate and a liquid metal and an insulation protrusion portion disposed thereon. The liquid metal is pressed by the heat dissipation plate and the first electronic component. The insulation protrusion portion covers and abuts against the insulation film to press the foam glue body through the base material so as to deform the foam glue body and enable the foam glue body to cover the second electronic component.

13 Claims, 4 Drawing Sheets

(51) Int. Cl.
*H10W 72/00* (2026.01)
*H10W 72/30* (2026.01)
*H10W 76/47* (2026.01)

(52) U.S. Cl.
CPC .... *H10W 72/07354* (2026.01); *H10W 72/347* (2026.01); *H10W 72/354* (2026.01); *H10W 90/734* (2026.01); *H10W 90/736* (2026.01)

(58) Field of Classification Search
CPC ... H10W 90/736; H10W 72/30; H10W 40/22; H10W 40/226; H10W 40/258; H10W 74/114; H10W 72/354; H10W 74/127; H10W 74/47; H10W 76/42; H05K 7/20445
See application file for complete search history.

(56) References Cited

U.S. PATENT DOCUMENTS

| | | | | | |
|---|---|---|---|---|---|
| 5,777,847 | A * | 7/1998 | Tokuno | H10W 76/60 | 257/713 |
| 5,907,474 | A * | 5/1999 | Dolbear | H10W 72/30 | 257/E23.09 |
| 2010/0231460 | A1* | 9/2010 | Chiang | H01Q 1/2258 | 343/702 |
| 2014/0002989 | A1* | 1/2014 | Ahuja | H10W 40/10 | 361/679.54 |
| 2016/0120068 | A1* | 4/2016 | Tien | B32B 9/007 | 428/167 |
| 2017/0186665 | A1* | 6/2017 | Choudhury | H10W 40/22 | |
| 2021/0043543 | A1* | 2/2021 | Eid | H10W 40/73 | |
| 2021/0337696 | A1* | 10/2021 | Lin | H05K 7/20481 | |
| 2022/0262759 | A1* | 8/2022 | Tsuchida | H10W 40/70 | |

* cited by examiner

ELECTRONIC PACKAGE STRUCTURE

CROSS-REFERENCE TO RELATED APPLICATION

This application claims the priority benefit of Taiwan application serial no. 112102431, filed on Jan. 18, 2023. The entirety of the above-mentioned patent application is hereby incorporated by reference herein and made a part of this specification.

BACKGROUND

Technical Field

The disclosure relates to an electronic package structure.

Description of Related Art

With the improvement of the function and the processing speed requirements of the electronic products, the semiconductor die as the core component of the electronic products requires higher density electronic components and electronic circuits, so a larger amount of heat energy is generated by the semiconductor die during operation. Furthermore, since the conventional encapsulant covering the semiconductor die is a poor heat transfer material with a heat conductivity of only 0.8 Wm−1k−1 (that is, the heat dissipation efficiency is not favorable), when the heat generated by the semiconductor die is not effectively dissipated, the heat generated will cause damage to the semiconductor die and product reliability issues. Therefore, in order to quickly dissipate the heat to the outside, the industry usually configures a heat dissipation plate in the semiconductor package. The heat dissipation plate is usually bonded to the back of the chip with a heat dissipation glue to dissipate the heat generated by the semiconductor die through the heat dissipation glue and the heat dissipation sheet. Furthermore, the top surface of the heat dissipation sheet is usually exposed to the encapsulant or directly exposed to the atmosphere so as to obtain a better heat dissipation effect.

The liquid metal is a low melting point alloy that is liquid at room temperature, or a solid sheet that becomes liquid when heated to the melting point thereof. The composition is, for example, gallium-indium-tin alloy, indium-bismuth-tin alloy, or indium-bismuth-zinc alloy, etc. The liquid metal is stable and has excellent heat conductivity and electrical conductivity, and the heat conductivity and the specific heat capacity thereof are much higher than the traditional silicone grease heat paste, so the liquid metal may be used as a heat conduction agent between the heat source and the heat dissipation fin to replace the heat dissipation glue above.

However, in practical applications, since the liquid metal at room temperature has high fluidity (a low viscosity), when the liquid metal is used as the heat conduction medium between the semiconductor die and the heat dissipation plate, it is often necessarily faced with the problem of overflow of the liquid metal in the process. That is, when the liquid metal is pressed by the heat dissipation plate and may overflow to the periphery of the semiconductor die, the liquid metal will often cause short circuit damage due to the liquid metal contacting the surrounding electronic components or the substrate (the circuit).

SUMMARY

The disclosure provides an electronic package structure, which provides a stable heat dissipation mechanism to protect the electronic component and the circuit.

An electronic package structure of the disclosure includes a first package module and a second package module. The first package module includes a substrate and a first electronic component disposed thereon, at least one second electronic component, and an insulation film. The first electronic component and the second electronic component are adjacent to each other. The insulation film includes a base material and a foam glue body, and the foam glue body is viscous and compressible. The second package module includes a heat dissipation plate and a liquid metal and an insulation protrusion portion disposed thereon. The first package module and the second package module are combined with each other. The liquid metal is pressed by the heat dissipation plate and the first electronic component. The insulation protrusion portion covers and leans against the insulation film to press the foam glue body through the base material so as to deform the foam glue body and enable the foam glue body to cover the second electronic component.

Based on the above, the electronic package structure is formed by combining the first package module and the second package module. The first package module is composed of a substrate, a first electronic component, at least one second electronic component, and an insulation film. The second package module is composed of a heat dissipation plate, a liquid metal, and an insulation protrusion portion. After the first and second package modules are respectively completed by the user, the two may be docked to complete the manufacture of the electronic package structure, and the manufacturing process may be simplified due to the above.

Moreover, the insulation film further includes a base material and a foam glue body. Since the foam glue body is viscous and compressible, the combined first and second package modules use the force applied when they are docked during the combination to enable the liquid metal to be pressed by the heat dissipation plate and the first electronic component. In addition, the insulation protrusion portion of the second package module may also cover and lean against the insulation film to press the foam glue body through the base material so as to deform the foam glue body and enable the foam glue body to cover the second electronic component. In this way, the second electronic component located around the first electronic component may be effectively covered and protected by the foam glue body. For the liquid metal that may overflow due to being pressed, the insulation protrusion portion and the insulation film may have the effects of isolation and protection to protect the second electronic component or the circuit on the substrate from contacting the liquid metal and causing a short circuit, so as to have the effects of both heat dissipation and protection.

DESCRIPTION OF THE EMBODIMENTS

Figure 1:
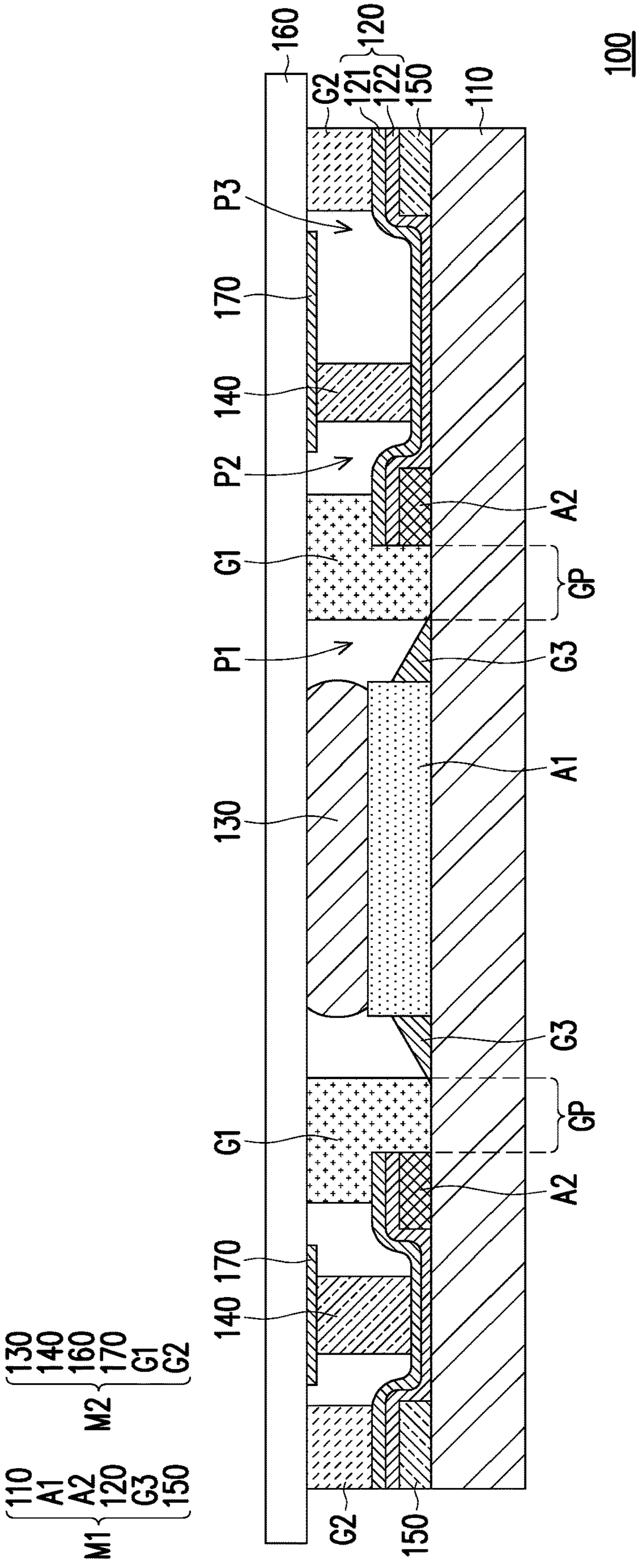
FIG. 1 is a cross-sectional view of an electronic package structure according to an embodiment of the disclosure.
Figure 2:
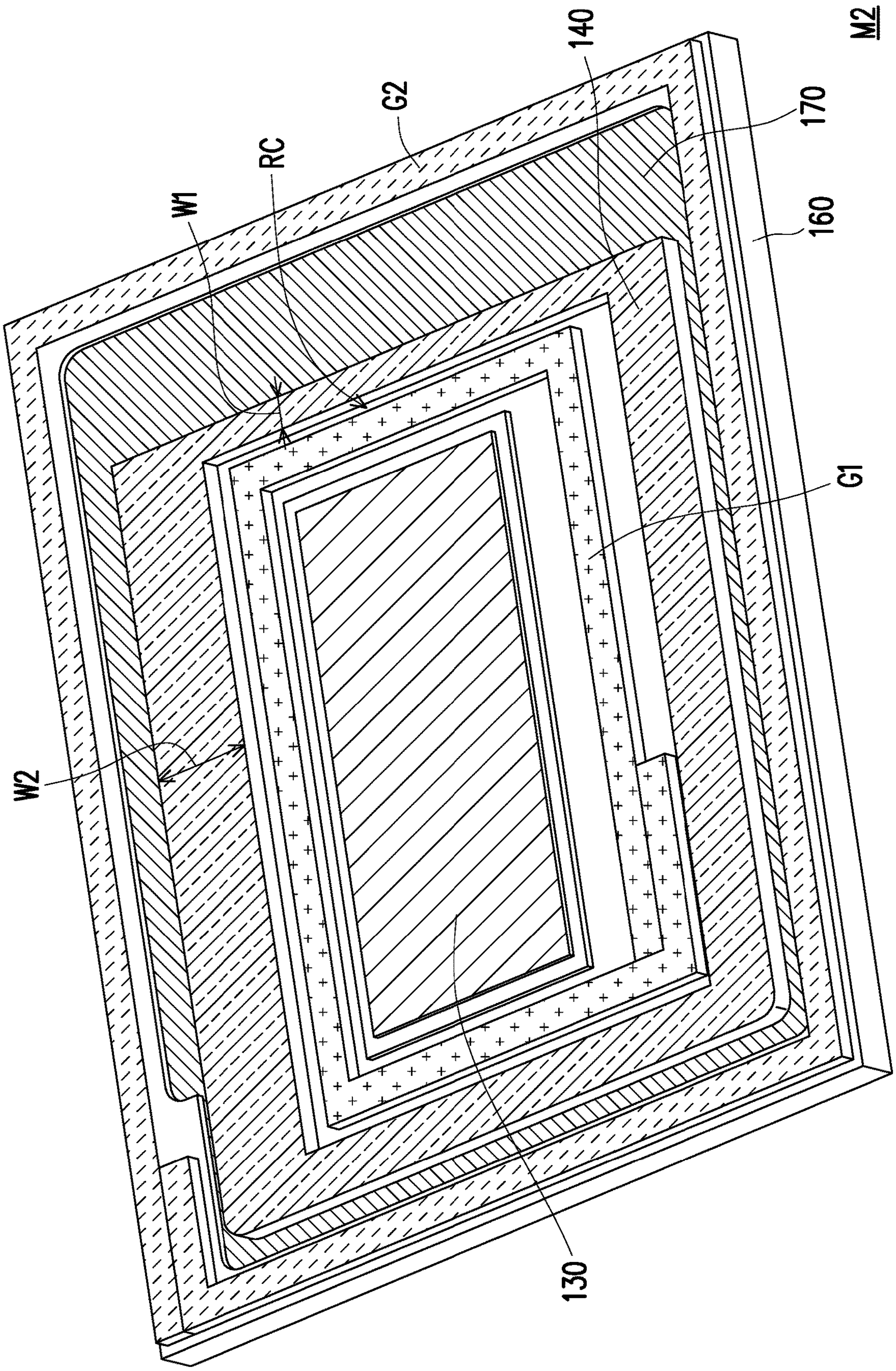
FIG. 2 and FIG. 3 are partial schematic views of the electronic package structure of FIG. 1, respectively.
Figure 3:
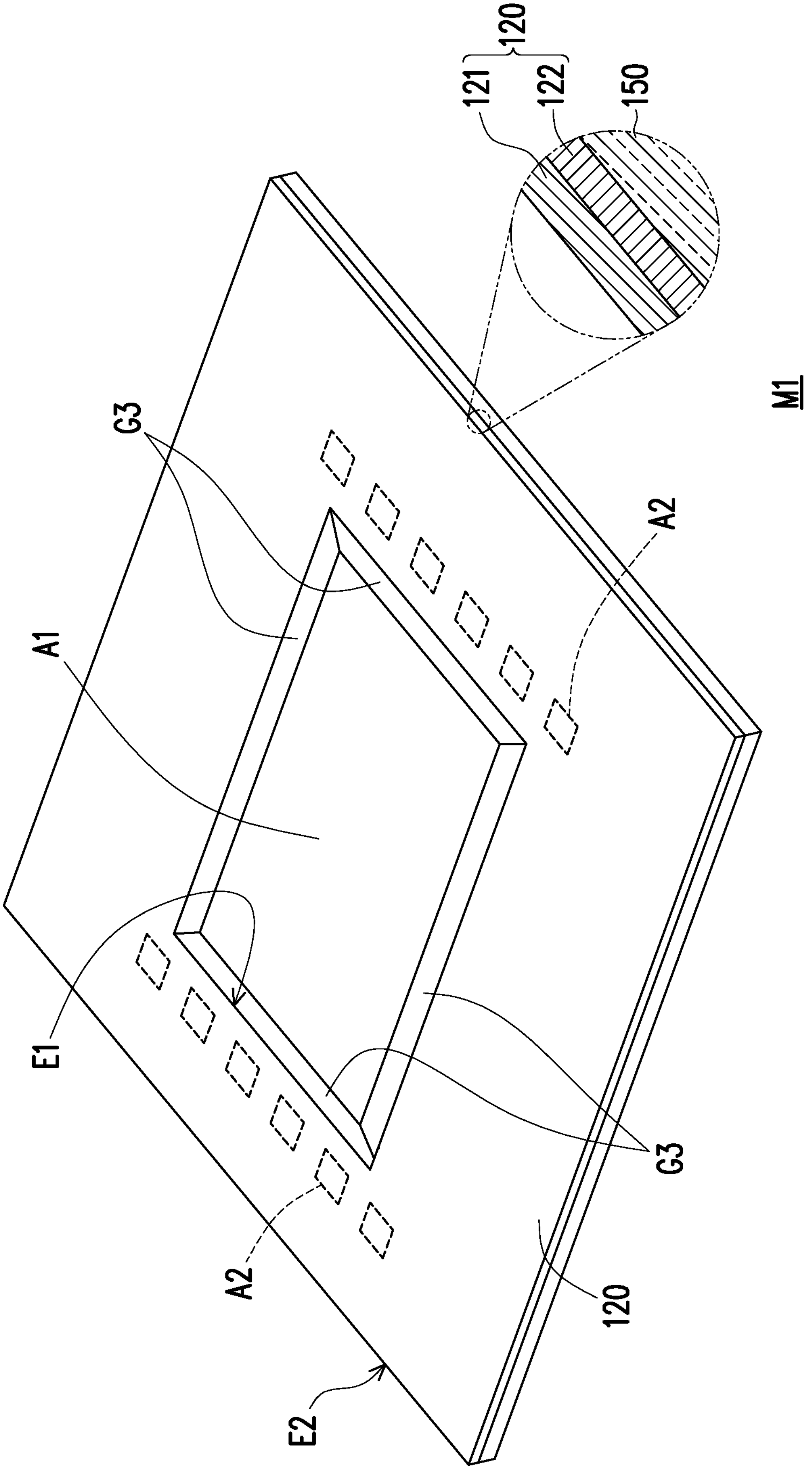

FIG. 1 is a cross-sectional view of an electronic package structure according to an embodiment of the disclosure. FIG. 2 and FIG. 3 are partial schematic views of the electronic package structure of FIG. 1, respectively. Please refer to FIG. 1 to FIG. 3 at the same time. In the embodiment, an electronic package structure 100 includes a first package module M1 and a second package module M2. The first package module M1 includes a substrate 110 and a first electronic component A1 disposed thereon, at least one second electronic component A2, and an insulation film 120. The first electronic component A1 and the second electronic component A2 are adjacent to each other. The first electronic component A1 is a semiconductor die, for example, configured to form a central processing unit (a CPU) or a graphics processing unit (a GPU). The second electronic component A2 is an auxiliary electronic component configured with the first electronic component A1, such as a capacitor. The substrate 110 is, for example, a motherboard carrying the above-mentioned electronic components, on which multiple circuits (not shown) are disposed. The insulation film 120 includes a base material 121 and a foam glue body 122. The base material 121 is, for example, a polyimide film (a PI film). The foam glue body 122 is viscous and compressible. The density thereof is 804-807 kg/m3 and the shore hardness thereof is (shore 00) 62-64.

Furthermore, the second package module M2 includes a heat dissipation plate 160, a liquid metal 130 disposed thereon, and an insulation protrusion portion. The insulation protrusion portion is exemplified by an insulation glue G1 in the embodiment. At the same time, the second package module M2 also includes an insulation glue G2. The insulation glues G1 and G2 are, for example, non-conductive (insulation) polymer gels, and the heat dissipation plate 160 is, for example, a copper heat dissipation plate. The heat sink (such as a heat dissipation fin, a fan, or a related heat sink, not shown) may be added on the other side of the liquid metal 130 so as to transfer the heat out of the electronic package structure 100. At the same time, in order to prevent the copper heat dissipation plate from being corroded due to direct contact with the liquid metal 130, an anti-corrosion metal layer is provided on the surface of the copper heat dissipation plate as an isolation layer of the copper heat dissipation plate.

It may be seen from the above that after the first package module M1 and the second package module M2 are respectively completed, the first package module M1 and the second package module M2 may be docked to form the electronic package structure 100. It is worth noting that the force provided during the above-mentioned docking process may produce a press and clamp effect on some components, thereby achieving the desired purpose. The liquid metal 130 is pressed by the heat dissipation plate 160 and the first electronic component A1. The insulation protrusion portion (the insulation glue G1) on the heat dissipation plate 160 covers and leans against the insulation film 120 to press the foam glue body 122 through the base material 121 so as to deform the foam glue body 122 and enable the foam glue body 122 to cover the second electronic component A2, which are described in detail later.

Please refer to FIG. 1 and FIG. 2 again. The component composition of the second package module M2 is described first. In addition to the above, the second package module M2 of the embodiment further includes a foam 140 and a carrier layer 170 respectively disposed on the heat dissipation plate 160, and the carrier layer 170 is located between the heat dissipation plate 160 and the foam 140. Here, the carrier layer 170 is, for example, a polyester film Mylar (a PET film), which has considerable hardness to facilitate a better operating feeling for the user. Simply put, the foam 140 of the embodiment needs to be cut according to the actual configuration environment and conditions of the situation. Once the cut size is small, it is not conducive for the user to smoothly configure (attach) the foam 140 to the heat dissipation plate 160.

For example, as shown in FIG. 2, the foam 140 surrounds the second electronic component A2 and the first electronic component A1. A part of the foam 140 that is positioned laterally adjacent to the second electronic component A2 has a width W1, wherein W1 is the width of the part of the foam 140 positioned between the second electronic component A2 and the outer periphery of the foam 140 in the lateral direction. A remaining part of the foam 140 has a width W2 that is larger than W1, where W2 is the width of the remaining part of the foam 140 surrounding the outer periphery. There is a recess RC shown in FIG. 2 that exists between the insulation protrusion portion (the insulation glue G1) and the foam 140, so that after the second package module M2 and the first package module M1 are combined, the recess RC shown forms a required space for accommodating the second electronic component A2. Therefore, the foam 140 may only maintain its width W1 in the part shown. Accordingly, in order to increase the convenience of the user during assembly, the foam 140 of the embodiment needs to be disposed on the carrier layer 170 first, and then the foam 140 is attached to the heat dissipation plate 160 by means of the carrier layer 170. Conversely, in another embodiment not shown, without the precondition that the size is too small to be easily assembled and operated, the foam 140 may be directly assembled to the heat dissipation plate 160 without needing the carrier layer 170.

Next, please refer to FIG. 1 and FIG. 3 at the same time. The first package module M1 is described here. In the embodiment, the first package module M1 further includes a retaining wall 150, which is disposed on the substrate 110 and surrounds the first electronic component A1 and the second electronic component A2. An inner side edge E1 of the insulation film 120 covers the second electronic component A2 and surrounds the first electronic component A1, and an outer side edge E2 of the insulation film 120 covers the retaining wall 150. Moreover, the first package module M1 further includes a fixing glue G3, which is disposed on the substrate 110 and located on the periphery of the first electronic component A1 so as to fix the first electronic component A1 on the substrate 110. There is a gap GP between the second electronic component A2 and the fixing glue G3. Here, the fixing glue G3 is, for example, an epoxy material, which is suitable for continuous completion when the first electronic component A1 is packaged on the substrate 110.

So far, the components of the first package module M1 and the second package module M2 have been as described above, and the features produced after the first package module M1 and the second package module M2 are docked with each other are described below.

Please refer to FIG. 1 again. When the first package module M1 and the second package module M2 are combined, part of the insulation protrusion portion (the insulation glue G1) also fills in the aforementioned gap GP and thus covers part of the side surface of the second electronic component A2. In other embodiments not shown, the insulation glue G1 also partially overlaps with the fixing glue G3, but no matter whether the insulation glue G1 and the fixing glue G3 overlap each other or not, the respective effects mentioned above are not affected. In addition, in the embodiment, the insulation glues G1 and G2 may be uncured heat conduction gels (H-Putty), and the thickness thereof must be controlled below 1.2 mm so as to ensure the compressibility thereof to be in contact with the surrounding structure and be pressed.

It should be noted that, the above-mentioned corresponding configuration of the insulation film 120 and the insulation glue G1 may also effectively reduce the difficulty of the process when the first package module M1 and the second package module M2 are docked and combined. In the embodiment, there is a gap of only 2.3 mm between the fixing glue G3 and the capacitor (the second electronic component A2), so it is not easy for the insulation glue G1 to accurately control the application scope and use amount. What the prior art does is to only coat all the second electronic component A2 with the insulation glue G1, but obviously it has disadvantages such as an excessive use amount of the insulation glue G1 and a longer application time. Accordingly, in order to effectively reduce the use amount of the insulation glue G1, in the embodiment, the insulation film 120 is used together with the insulation glue G1. The insulation film 120 is used to attach and cover at least most of the second electronic component A2, so as to save the application time, and the remaining part is filled with the insulation glue G1.

Furthermore, when the first package module M1 and the second package module M2 are combined, the foam 140 surrounds the first electronic component A1 and the second electronic component A2, and the foam 140 leans against the base material 121 of the insulation film 120, so that the foam 140, the base material 121 of the insulation film 120, and the foam glue body 122 are clamped between the heat dissipation plate 160 and the substrate 110. Since the insulation glue G1 is pressed against the base material 121 due to the force applied during docking, it may further exert pressure on the foam glue body 122 and cause the deformation thereof, so that the foam glue body 122 may not only contact the top surface of the second electronic component A2, but also extend to the side of the second electronic component A2 due to the deformation, thereby creating a wrapping effect in which the second electronic component A2 is substantially trapped in the foam glue body 122. Conversely, in order to smoothly use the docking force of the first package module M1 and the second package module M2 to deform the foam glue body 122, the insulation glue G1 and the heat dissipation plate 160 are in a seamless contact (configuration), as shown in FIG. 1.

Similarly, the same is true for the foam 140. Since the part where the foam 140 is located still has the foam glue body 122, it is also necessary to ensure the abutting relationship between the components through the seamless contact, so as to facilitate the aforementioned docking force to deform the compressible foam 140 and even the foam glue body 122.

In addition, when the first package module M1 and the second package module M2 are combined, the insulation glue G2, the outer side edge E2 of the insulation film 120, and the retaining wall 150 are clamped between the heat dissipation plate 160 and the substrate 110, and as mentioned above, the seamless contact between the components is beneficial to produce the required insulation effect.

As shown in FIG. 1, when the first package module M1 and the second package module M2 are combined, the insulation glue G1, the foam 140 (and the carrier layer 170), a part of the insulation film 120, the retaining wall 150, and another part of the insulation film 120 (the outer side edge E2) and the insulation glue G2 form multiple spaces P1, P2, P3 annularly disposed layer by by layer between the substrate 110 and the heat dissipation plate 160. The first electronic component A1 and the liquid metal 130 are located in the innermost space P1, and the spaces P1, P2, and P3 are used as buffers for preventing the liquid metal 130 from overflowing.

In detail, as mentioned above, since the liquid metal 130 is pressed by the force when the first package module M1 and the second package module M2 docks and combines with each other, the problem of overflow of the liquid metal 130 is faced during the process. In the embodiment, different degrees of anti-blocking effects are provided through the spaces P1, P2, and P3 formed by the above-mentioned components. In other words, the spaces P1, P2, and P3 are used for the overflow of the liquid metal 130, and since the insulation glue G1 and the insulation glue G2 have provided protection for the upper surface of the second electronic component A2 or the substrate 110, the occurrence of electrical short circuit may be avoided.

In addition, it should be mentioned that the foam 140 of the embodiment is SM-55 porous foam with a density of 57±5 kg/m3. In addition to having the compressibility to withstand the force exerted when the heat dissipation plate 160 and substrate 110 are docked, the porous structure thereof may also provide an adsorption effect on the liquid metal 130 overflowing into the space P2 or the space P3, thereby preventing the liquid metal 130 from overflowing outside of the electronic package structure 100.

Figure 4:
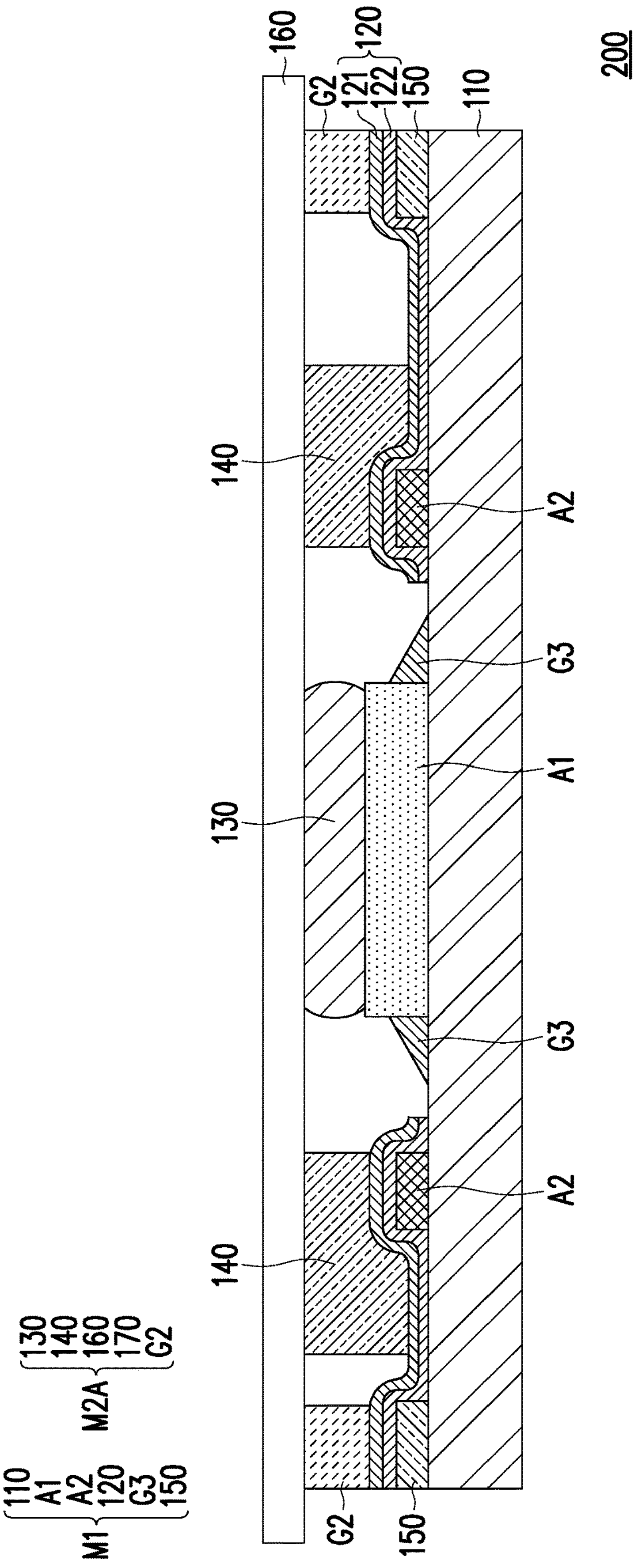
FIG. 4 is a cross-sectional view of an electronic package structure according to another embodiment of the disclosure.

FIG. 4 is a cross-sectional view of an electronic package structure according to another embodiment of the disclosure. Please refer to FIG. 4. The difference between the embodiment and the aforementioned embodiment shown in FIG. 1 is that in an electronic package structure 200 of the embodiment, the insulation protrusion portion of a second package module M2A is exemplified by an insulation foam, and in particular exemplified by the foam 140. As for the first package module M1, the first package module M1 is the same as the above-mentioned embodiment and so is drawn with the same symbol and is not described again. In other words, in the embodiment, the foam 140 is also used to replace the use of the aforementioned insulation glue G1.

In this way, as shown in FIG. 4, when the second package module M2A and the first package module M1 are combined together, the second package module M2A is pressed against the insulation film 120 by the foam 140. A part (an inner side) of the insulation film 120 covers the second electronic component A2, and is deformed when pressed by the insulation protrusion portion (the foam 140) so that the foam glue body 122 is attached to the substrate 110. Another part (the central part) of the insulation film 120 directly leans against (and attaches to) the substrate 110 when pressed by the foam 140. A still another part (an outer side) of the insulation protrusion portion (the foam 140) covers the retaining wall 150, and the heat dissipation plate 160 is also coated on the insulation film 120 with the insulation glue G2, so that the still another part of the insulation protrusion portion is clamped between the insulation glue G2 and the retaining wall 150. As for the second electronic component A2, the second electronic component A2 may also be completely covered by the foam glue body 122 being pressed.

To sum up, in the above embodiments of the disclosure, the electronic package structure is formed by combining the first package module and the second package module. The first package module is composed of the substrate, the first electronic component, the at least one second electronic component, and the insulation film. The second package module is composed of the heat dissipation plate, the liquid metal, and the insulation glue. After the first and second package modules are respectively completed by the user, the two may be docked to complete the manufacture of the electronic package structure, and the manufacturing process may be simplified due to the above.

Moreover, the insulation film further includes a base material and a foam glue body. Since the foam glue body is viscous and compressible, the combined first and second package modules use the force applied when they are docked during the combination to enable the liquid metal to be pressed by the heat dissipation plate and the first electronic component. In addition, the insulation glue of the second package module may also cover and lean against the insulation film to press the foam glue body through the base material so as to deform the foam glue body and enable the foam glue body to cover the second electronic component.

In this way, the second electronic component located around the first electronic component may be effectively covered and protected by the foam glue body. For the liquid metal that may overflow due to being pressed, the insulation glue and the insulation film may have the effects of isolation and protection to protect the second electronic component or the circuit on the substrate from contacting the liquid metal and causing a short circuit so as to have the effects of both heat dissipation and protection.

In addition, the above-mentioned components form multiple spaces annularly disposed layer by layer between the substrate and the heat dissipation plate. The first electronic component is located in the innermost space, and the remaining spaces are all arranged as annularly disposed layer by layer relative to the innermost space. Accordingly, the spaces may be used for the overflow of the liquid metal. The second electronic component and the upper surface of the substrate may be isolated from the overflow of the liquid metal by the protection of the insulation glue and the insulation film. In addition, the porous structure of the foam as one of the barrier structures may also be used to adsorb the liquid metal and prevent the liquid metal from overflowing outside of the electronic package structure.

What is claimed is:

1. An electronic package structure, comprising:

a first package module, comprising a substrate, a first electronic component, at least one second electronic component, and an insulation film, wherein the first electronic component and the at least one second electronic component are disposed on the substrate and adjacent to each other, the insulation film is disposed on the substrate, the insulation film comprises a base material and a foam glue body, and the foam glue body is viscous and compressible;

a second package module, comprising a heat dissipation plate, a liquid metal, and an insulation protrusion portion, wherein the liquid metal and the insulation protrusion portion are disposed on the heat dissipation plate, wherein the first package module and the second package module are combined correspondingly, the liquid metal is pressed by the heat dissipation plate and the first electronic component, and the insulation protrusion portion covers and abuts against the insulation film and presses the foam glue body through the base material so as to deform the foam glue body and enable the foam glue body to cover the second electronic component, wherein the insulation protrusion portion is a first insulation glue, and the first insulation glue and the liquid metal are respectively coated on the heat dissipation plate, wherein the second package module further comprises a foam disposed on the heat dissipation plate, after the first package module and the second package module are combined, the foam surrounds the first electronic component and the second electronic component, and the foam leans against the base material of the insulation film so that the foam, the base material of the insulation film, and the foam glue body are clamped between the heat dissipation plate and the substrate.

2. The electronic package structure according to claim 1, wherein the second package module further comprises a carrier layer disposed on the heat dissipation plate, and the foam is disposed on the carrier layer so that the carrier layer is located between the heat dissipation plate and the foam.

3. The electronic package structure according to claim 1, wherein a width of a part of the foam is smaller than a width of a remaining part of the foam.

4. The electronic package structure according to claim 1, wherein the foam is a SM-55 foam with a density of 57±5 kg/m3.

5. An electronic package structure, comprising:

a first package module, comprising a substrate, a first electronic component, at least one second electronic component, and an insulation film, wherein the first electronic component and the at least one second electronic component are disposed on the substrate and adjacent to each other, the insulation film is disposed on the substrate, the insulation film comprises a base material and a foam glue body, and the foam glue body is viscous and compressible;

a second package module, comprising a heat dissipation plate, a liquid metal, and an insulation protrusion portion, wherein the liquid metal and the insulation protrusion portion are disposed on the heat dissipation plate, wherein the first package module and the second package module are combined correspondingly, the liquid metal is pressed by the heat dissipation plate and the first electronic component, and the insulation protrusion portion covers and abuts against the insulation film and presses the foam glue body through the base material so as to deform the foam glue body and enable the foam glue body to cover the second electronic component, wherein the first package module further comprises a retaining wall disposed on the substrate and surrounding the first electronic component and the second electronic component, an inner side edge of the insulation film covers the second electronic component and surrounds the first electronic component, and an outer side edge of the insulation film covers the retaining wall, wherein the second package module further comprises a second insulation glue disposed on the heat dissipation plate, and after the first package module and the second package module are combined, the second insulation glue, the outer side edge of the insulation film, and the retaining wall are clamped between the heat dissipation plate and the substrate.

6. The electronic package structure according to claim 5, wherein the second package module further comprises a foam disposed on the heat dissipation plate, after the first package module and the second package module are combined, a first insulation glue, being the insulation protrusion portion, the foam, the insulation film, the retaining wall, and the second insulation glue form a plurality of spaces annularly disposed layer by layer between the substrate and the heat dissipation plate, the first electronic component and the liquid metal are located in an innermost space of the plurality of spaces, and the spaces are used as buffers against an overflow of the liquid metal.

7. An electronic package structure, comprising:

a first package module, comprising a substrate, a first electronic component, at least one second electronic component, and an insulation film, wherein the first electronic component and the at least one second electronic component are disposed on the substrate and adjacent to each other, the insulation film is disposed on the substrate, the insulation film comprises a base material and a foam glue body, and the foam glue body is viscous and compressible;

a second package module, comprising a heat dissipation plate, a liquid metal, and an insulation protrusion portion, wherein the liquid metal and the insulation protrusion portion are disposed on the heat dissipation plate, wherein the first package module and the second package module are combined correspondingly, the liquid metal is pressed by the heat dissipation plate and the first electronic component, and the insulation protrusion portion covers and abuts against the insulation film and presses the foam glue body through the base material so as to deform the foam glue body and enable the foam glue body to cover the second electronic component, wherein the insulation protrusion portion is a first insulation glue, and the first insulation glue and the liquid metal are respectively coated on the heat dissipation plate, wherein the first package module further comprises a fixing glue disposed on the substrate and located at a periphery of the first electronic component so as to fix the first electronic component on the substrate, a gap exists between the at least one second electronic component and the fixing glue, and a part of the first insulation glue is filled in the gap.

8. The electronic package structure according to claim 7, wherein the first insulation glue covers part of the fixing glue.

9. An electronic package structure, comprising:

a first package module, comprising a substrate, a first electronic component, at least one second electronic component, and an insulation film, wherein the first electronic component and the at least one second electronic component are disposed on the substrate and adjacent to each other, the insulation film is disposed on the substrate, the insulation film comprises a base material and a foam glue body, and the foam glue body is viscous and compressible;

a second package module, comprising a heat dissipation plate, a liquid metal, and an insulation protrusion portion, wherein the liquid metal and the insulation protrusion portion are disposed on the heat dissipation plate, wherein the first package module and the second package module are combined correspondingly, the liquid metal is pressed by the heat dissipation plate and the first electronic component, and the insulation protrusion portion covers and abuts against the insulation film and presses the foam glue body through the base material so as to deform the foam glue body and enable the foam glue body to cover the second electronic component, wherein the insulation protrusion portion is an insulation foam, and after the first package module and the second package module are combined, the insulation foam surrounds the first electronic component and covers the second electronic component, wherein a part of the insulation film covers the second electronic component, the part of the insulation film is pressed by the insulation foam, and another part of the insulation film is pressed by the insulation foam to lean against the substrate.

10. The electronic package structure according to claim 9, wherein the first package module further comprises a retaining wall disposed on the substrate and surrounding the first electronic component and the second electronic component, and still another part of the insulation film covers the retaining wall, and the another part of the insulation film is located between the still another part and the part of the insulation film.

11. The electronic package structure according to claim 10, wherein the second package module further comprises an insulation glue disposed on the heat dissipation plate, and after the first package module and the second package module are combined, the insulation glue, the still another part of the insulation film, and the retaining wall are clamped between the heat dissipation plate and the substrate.

12. The electronic package structure according to claim 9, wherein the first package module further comprises a fixing glue disposed on the substrate and located at a periphery of the first electronic component so as to fix the first electronic component on the substrate.

13. The electronic package structure according to claim 1, wherein the foam glue body is pressed and attached to the substrate to completely cover the second electronic component.

* * * * *